(12) United States Patent
Bhatt et al.

(10) Patent No.: US 6,274,291 B1
(45) Date of Patent: *Aug. 14, 2001

(54) METHOD OF REDUCING DEFECTS IN I/C CARD AND RESULTING CARD

(75) Inventors: Ashwinkumar C. Bhatt, Endicott; John C. Camp, Owego; Mary Beth Fletcher, Vestal; Kenneth Lynn Potter, Kirkwood; John A. Welsh, Binghamton, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,010

(22) Filed: Nov. 18, 1998

(51) Int. Cl.[7] .................................................. G03F 7/00
(52) U.S. Cl. .......................... 430/312; 430/315; 430/319
(58) Field of Search ............................... 430/312, 315, 430/319

(56) References Cited

U.S. PATENT DOCUMENTS

| | | | |
|---|---|---|---|
| 3,660,726 | 5/1972 | Ammon et al. | 317/101 |
| 4,511,757 | 4/1985 | Ors et al. | 174/68.5 |
| 4,902,610 * | 2/1990 | Shipley | 430/312 |
| 4,980,270 * | 12/1990 | Inasaka | 430/312 |
| 5,034,091 | 7/1991 | Trask et al. | 156/643 |
| 5,227,588 | 7/1993 | Schreiber et al. | 174/262 |
| 5,231,751 | 8/1993 | Sachdev et al. | 29/852 |
| 5,266,446 * | 11/1993 | Chang | 430/314 |
| 5,293,504 | 3/1994 | Knickerbocker et al. | 174/262 |
| 5,302,219 | 4/1994 | Hargis et al. | 156/89 |
| 5,354,593 * | 10/1994 | Grandmont | 428/137 |
| 5,460,921 | 10/1995 | Cywar et al. | 430/314 |
| 5,485,038 * | 1/1996 | Licari | 257/758 |
| 5,626,771 | 5/1997 | Davis et al. | 216/13 |
| 5,837,427 * | 11/1998 | Hwang | 430/312 |
| 5,946,550 * | 8/1999 | Papadimitrakopoulos | 438/99 |

* cited by examiner

Primary Examiner—Mark F. Huff
Assistant Examiner—Nicole Barreca
(74) Attorney, Agent, or Firm—William N. Hogg

(57) ABSTRACT

A technique is provided for forming a circuitized substrate which substantially reduces defects in a circuit board formed of multiple layers of dielectric material on each of which layers electrical circuitry is formed. Each layer of dielectric material is formed of two distinct and separate coatings or sheets or films of a photopatternable dielectric material which is photoformed to provide through openings to the layer of circuitry below and then plated with the desired circuitry including plating in the photoformed openings to form vias. In this way if there is a pin hole type defect in either coating or sheet of dielectric material, in all probability it will not align with a similar defect in the other sheet or coating of the dielectric layer, thus preventing unwanted plating extending from one layer of circuitry to the underlying layer of circuitry.

10 Claims, 2 Drawing Sheets

METHOD OF REDUCING DEFECTS IN I/C CARD AND RESULTING CARD

BACKGROUND OF THE INVENTION

1. Field of the Invention

This invention relates generally to a technique for manufacturing circuit boards with reduced defects and the resulting board, and more particularly to a technique for reducing board defects in manufacturing a high density board with thin dielectric layers, which layers are prone to have pinhole like defects.

2. Background Information

In the manufacture of circuit boards and circuit cards and chip carriers (sometimes collectively referred to as circuit boards herein) one common technique is to form successive layers of dielectric material with circuitry formed thereon which forms multi layer circuit boards. As the circuitry becomes more dense, and particularly as the layers of dielectric material become thinner, due to technological advances, the board becomes more prone to be defective due to defects in the material. For example, pin hole type defects in the dielectric material may cause unwanted circuit connections between one layer of electrical circuitry and the next adjacent layer of circuitry. This can occur when plating is taking place to form a layer of circuitry on a layer of dielectric material which overlays another layer of dielectric material having electrical circuitry thereon. If there is a pin hole defect extending through the dielectric material on which the circuitry is being formed, and the pin hole defect overlies electrical circuity there beneath, the plating process may cause the defect to be plated and thus establish an unwanted connection between two layers of circuitry. These defects can cause the scrapping of circuit boards late in the manufacturing process, which is costly. Thus it is desirable to reduce manufacturing defects in circuit boards due defects of the pin hole type in the layers of dielectric material.

SUMMARY OF THE INVENTION

According to the present invention, a technique is provided which substantially reduces defects in a circuit board formed of multiple layers of dielectric material on each of which layers electrical circuitry is formed. Each layer of dielectric material is formed of two distinct and separate coatings or sheets or films of a photopatternable dielectric material which is photoformed to provide through openings to the layer of circuitry below and then plated with the desired circuitry including plating in the photoformed openings to form vias. In this way if there is a pin hole type defect in either coating or sheet of dielectric material, in all probability it will not align with a similar defect in the other sheet or coating of the dielectric layer, thus preventing unwanted plating extending from one layer of circuitry to the underlying layer of circuitry.

DESCRIPTION OF THE PREFERRED EMBODIMENT(S)

Figure 1A:
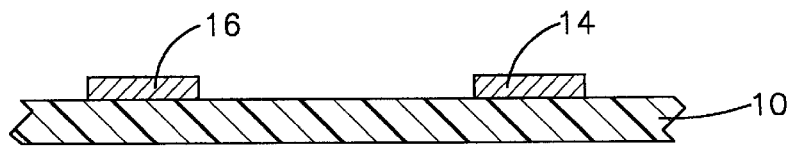
FIG. 1a through 1j depict the steps in forming circuit board according to this invention.

Referring now to the drawings, the various steps in forming a circuit board according to this invention are shown. The process can be used to form various circuitized substrates such as circuit boards, cards, chip carriers and the like, which will be referred to collectively as circuit boards.

As shown in FIG. 1a a dielectric substrate 10 is provided which has electrical circuitry formed thereon including connection pads 14 and circuit traces 16. The substrate can be of any dielectric material such as ceramics or organic polymers such as polyimides or polytetrafluoroethylene (PTFE), and the circuitry can be any conductor preferably copper.

Figure 1B:
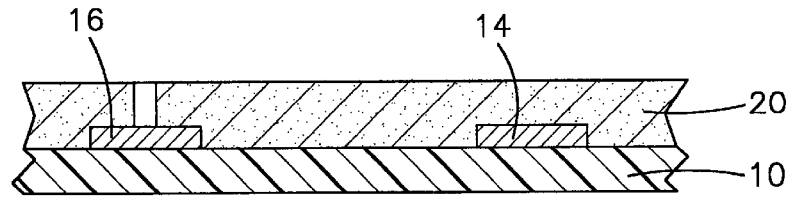

As shown in FIG 1b a film of photoimagable dielectric material 20 is applied over the circuitized substrate 10. This material can be applied in either liquid form by curtain coating or screen printing, or applied as a dry film. The thickness of the film 20 preferably is from about 1 mil to about 3 mils thick. The material 20 preferably is a particularly useful photoimagable material is an epoxy-based material of the type described in U.S. Pat. No. 5,026,624, entitled "Composition for Photoimaging", commonly assigned, which is incorporated herein by reference. This material is photoimaged or photopatterned, developed to reveal the desired pattern, and thereafter cured to provide a dielectric substrate on which metal circuit traces such as plated copper can be formed for forming the circuit board. The dielectric material may be curtain coated as described in said U.S. Pat. No. 5,026,624, or it can contain a thixotrope and be screen applied as described in U.S. Pat. No. 5,300,402. The material may also be applied as a dry film. A technique for forming a dry film is as follows:

The photoimagable dielectric composition is prepared having a solids content of from about 86.5 to 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% Fc 430 a fluorinated polyether nonionic surfactant from 3M Company; 3.85% Aerosil 380, an amorphous silicon dioxide from Degussa; to provide the solid content. A solvent was present from about 11 to 13.5% of the total photoimageable dielectric composition. The photoimageable dielectric composition is coated onto a 1.42 mil thick segment of polyethylene terephthalate designated Mylar D a segment of polyethylene terephthalate designated Mylar D a polyester layer from DuPont. The photoimageable dielectric composition is allowed to dry to provide a 2.8 mil thick photoimageable dielectric film on the polyethylene terephthalate backing.

The particular material as described in said U.S. Pat. Nos. 5,026,624 and 5,300,402 is negative acting photodielectric. Hence, those areas which are exposed to actinic radiation, in this case UV light, will not be developed (i.e., will remain) when the material is developed in developer, and areas which are not exposed will be removed, i.e., developed out. In the preferred embodiment the film is a dry film and is applied by vacuum lamination. If desired the circuitry on the substrate 10 can be treated to form black oxide such as with a chlorite solution sold by Shipley Corp. before laminating the film 20 to increase adhesion, or with other adhesion promoters, and the film is then baked at about 90° C. for about 30 minutes.

The Mylar backing is removed and the film 20 is then photopatterned to form openings, one of which is shown at 22, therein where connection to an underlying circuit pad 14 is desired. This is a conventional process wherein the film is exposed though a mask to u.v. radiation and then baked and developed in a conventional manner to form the openings 22. Preferably the radiation exposure is of from about 150 to about 2000 millijoules more preferably from about 1600 to about 2000 millijoules, followed by a bake at about 125° C. for about 20 to about 60 minutes. The developer preferably is any one of those disclosed in commonly assigned U.S. Pat. No. 5,268,260, preferably proplylene carbonate.

Figure 1C:
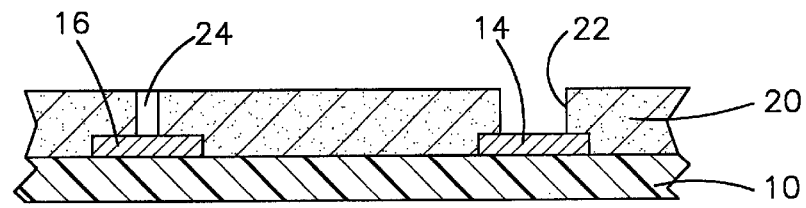

Following the development of the film 20 it is given a u.v. bump from about 3 to about 5 joules, and then fully cured by heating to about 180° C. for about 60 minutes. This will result in a fully cured film of dielectric material on which copper or other conductors can be plated. However with films this thin defects, such as pin holes, one of which is shown at 24 in FIG. 1c can occur either in the dry film as it is manufactured, on in the application of a liquid film; or, these defects can occur during the exposing and developing process and/or the curing process. In any event if such a defect 24 should occur which extends through the film 20, and circuitry were plated on top of the film 20 an unwanted "via" would be formed extending through the film 20; and, if there were circuitry such as circuit traces 16 there below, an unwanted connection would occur resulting in a defective part.

Figure 1D:
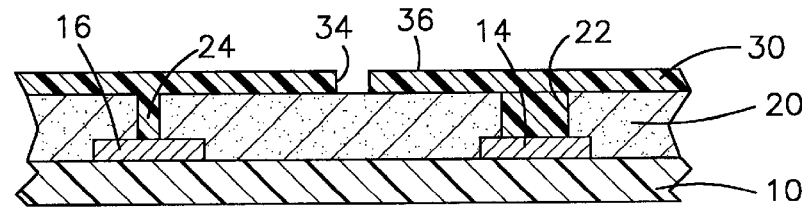
Figure 1E:
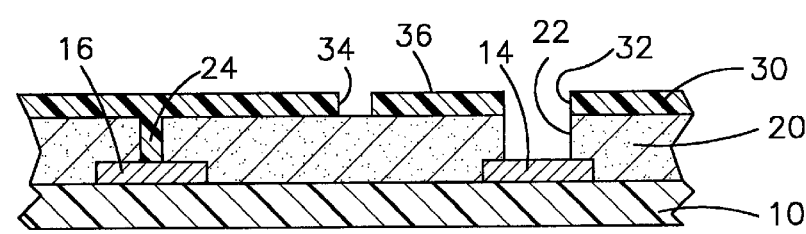

To overcome this problem a second film of photopatternable material 30 is applied over the film 20 as shown in FIG. 1d. If desired the surface of the film 20 can be vapor blasted before the second film 30 is applied to improve mechanical adhesion. The second film 30 can be the same material as the first film of material 20, and this also can be applied either as a liquid or as a dry film. However it is preferred that the second film be a liquid such as Enthone DSR an epoxy based photoimagable dielectric material manufactured by Enthone corp. This film is also photopatterned in the same way as the first film 20 by exposing to u.v. radiation, baking, and developing to form openings 32 aligned with openings 22 in the first film of material 20 as shown in FIG. 1e and then u.v. bumping and finally curing the second film. The alignment of the opening 32 with the opening 22 can be accomplished using conventional optical alignment techniques. Alternatively alignment can be accomplished by making hole 32 larger in diameter than hole 22 to thereby compensate for any small misalignments.

As was the case with the first film 20, the second film 30 also can develop or have defects of the pin hole type such as shown at 34. This defect also goes through the film 30. However there is very little possibility that the defects 24 and 34 will align with each other and thus no defect effectively extends through both films of material 20 and 30. Hence top surface 36 of the film 30 can be used to plate circuitry with little chance of an unwanted "via" extending from the surface 36 all the way through both films of material 20 and 30 to the circuitry on the substrate 10.

At this point any holes that need to be provided are drilled. The showing of holes, since optional, is omitted for clarity of illustration.

Figure 1F:
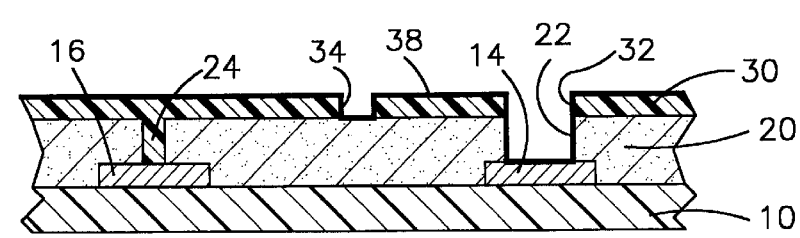
Figure 1G:
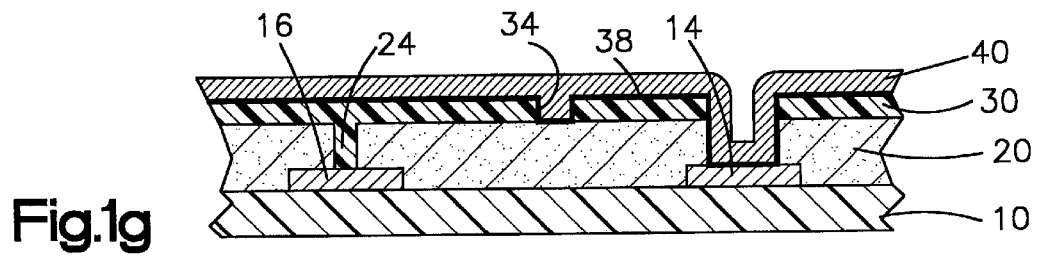

Circuitry on the top surface 36 of the film 30 is then formed by any conventional process, one of which is an acid plate subtractive etch process and which is shown in FIGS. 1f through 1j. As shown in FIG. 1f the top surface 36 of the film 30 as well as the openings 32 and 22 and the connection pad 14 are seeded with a conventional palladium salt 38 which where exposed will act to promote copper plating. Copper 40 is then plated over the entire surface 36 and into the openings 24,34 and on pad 14 as shown in FIG. 1g. Copper will also plate in the defect 34.

Figure 1H:
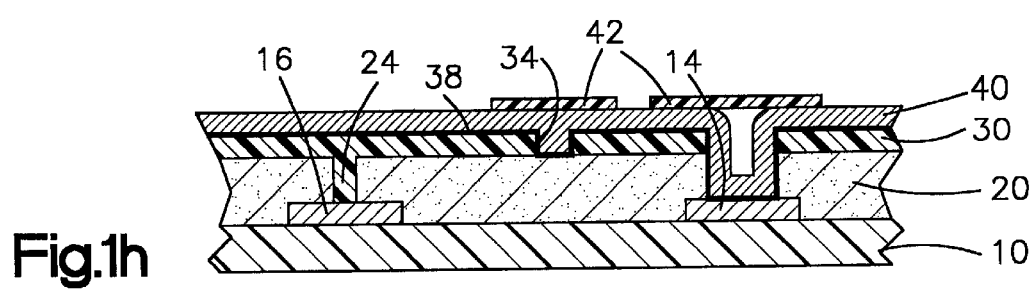
Figure 1I:
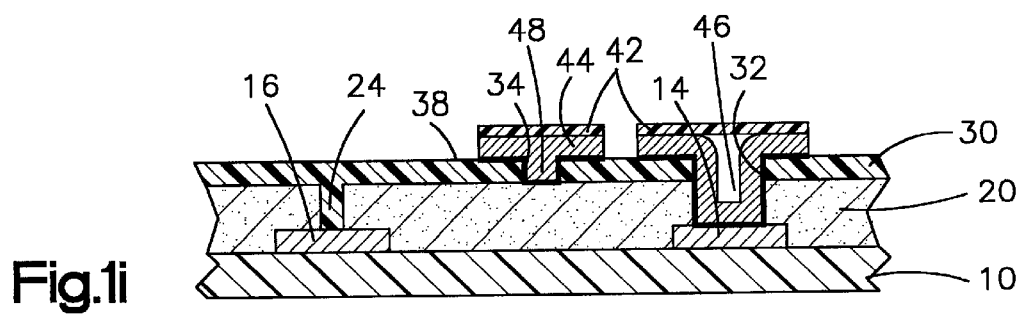
Figure 1J:
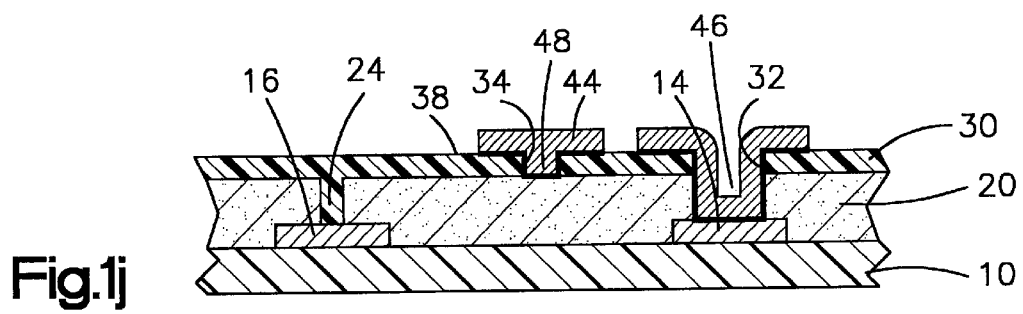

A photoresist material 42 is then applied over the copper layer 40 and patterned and developed as shown in FIG. 1h to reveal those ares where the copper is to be etched away and remain in those areas where copper circuitry is desired. A suitable resist is a dry film negative acting photoresist manufactured by McDermid Co. The exposed copper is then etched with cupric chloride to form the structure shown in FIG. 1i with circuit traces 44, and a plated hole or via 46. The remaining photoresist material 42 is then stripped to provide the structure shown in FIG. 1j.

As was noted above any defect 34 will be plated with copper as shown at 48. However this does not extend through the film 20 of dielectric material so it cannot contact the circuitry on the substrate 10. Since any defects in the dielectric films 20 and 30 probably will not align the plating will not result in defective parts.

It should be understood that additive plating processes could be used as well as subtractive processes. Moreover the plating can be electro plating or electroless plating.

It should be noted the u.v. bump and final cure of the first film 20 could be postponed until the u.v. bump and final cure of the second film 30 of dielectric material. However it is preferred that it be done as described so that any defects generated by this final stage not extend through both films 20, 30.

Also it should be noted that the same technique could be applied to both sides of the substrate 10 when there is circuitry on both side that require an additional layer of circuitry to be formed thereon. Moreover, multiple layers of circuitry can be formed, one overlying the other by the same technique.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of forming a circuitized substrate comprising the steps of:

providing a dielectric substrate having a layer of circuitry on at least one side thereof, applying a first film of photoimagable dielectric material in dry form having pinholes therein over said layer of circuitry on said substrate, photoforming one or more openings in said first film of photoimagable dielectric material to expose one or more selected portions of the circuitry on said substrate, applying a second film of photoimagable dielectric material in liquid form having pin holes therein directly on said first film of said photoimagable dielectric material while maintaining the surface of and the one or more openings and the pin holes in said first film free of any conductive material, photoforming one or more openings in said second film of said photoimagable dielectric material, each opening in said second film of said photoimagable material being in alignment with each of one of said one or more openings in said first film of photoimagable dielectric material to thereby form one or more continuous openings through both films of photoimagable dielectric material communicating with one or more of said selected portions of said circuitry on said substrate; and forming a pattern of conductive material on said second film of said photoimagable dielectric material and within each of said one or more continuous openings in both of said films of photoimagable dielectric material and on said selected portion of said circuitry on said substrate including the step of plating a metal onto said second film of photoimagable material and into each of the one or more continuous openings.

2. The invention as defined in claim 1 wherein each of the films of photoimagable dielectric material is curable, and wherein they are applied in a less than fully cured state, and wherein said films are cured before the forming of the pattern of conductive material.

3. The invention as defined in claim 2 wherein the first film is fully cured before the second film is applied.

4. The invention as defined in claim 1 wherein the plating process is an additive plating process.

5. The invention as defined in claim 1 wherein each of the films is from about 1 mil to about 3 mils thick.

6. A circuitized substrate comprising:

a dielectric substrate having a layer of circuitry on at least one side thereof;

a first film of photoimagable dielectric material having pin holes therein overlying said layer of circuitry on said substrate;

one or more photoformed openings in said first film of photoimagable dielectric material revealing one or more selected portion of the circuitry on said substrate, the surface of and pin holes in said first film of dielectric material being free of conductive material, a second film of photoimagable dielectric material having pin holes therein over said first film of said photoimagable dielectric material, said first film being applied in dry form and said second film being applied in liquid form, one or more photoformed openings in said second film of said photoimagable dielectric material, each opening in said second film of photoimagable material being in alignment with each of said one or more openings in said first film of photoimagable dielectric material and not elsewhere, thereby forming a continuous opening through both films of photoimagable dielectric material communicating with each said selected portion of said circuitry on said substrate; and a pattern of plated conductive material on said second film of said photoimagable dielectric material and within each of said continuous openings in both of said films of photoimagable dielectric material and on said selected portion of said circuitry on said substrate.

7. The invention as defined in claim 6 wherein each of the films is from about 1 mil to about 3 mils thick.

8. The invention as defined in claim 6 wherein each of the films of photoimagable dielectric material is curable, and wherein they are applied in a less than fully cured state, and wherein said films are cured before the forming of the pattern of plated conductive material.

9. The invention as defined in claim 8 wherein the first film is fully cured before the second film is applied.

10. The invention as defined in claim 9 wherein the plating process is an additive plating process.

\* \* \* \* \*